United States Patent [19]

Santini, Jr.

[11] Patent Number: 4,547,259

[45] Date of Patent: Oct. 15, 1985

[54] MANUFACTURE OF SHEETS OF CONTROLLED THICKNESS FROM MELTABLE MATERIAL

[75] Inventor: William A. Santini, Jr., Kittanning, Pa.

[73] Assignee: Silicon Electro-Physics, Inc., Bradford, Pa.

[21] Appl. No.: 501,221

[22] Filed: Jun. 6, 1983

Related U.S. Application Data

[63] Continuation-in-part of Ser. No. 242,498, Mar. 10, 1981, abandoned.

[51] Int. Cl.[4] ............................................. C30B 9/10
[52] U.S. Cl. ........................................ 156/607; 423/348
[58] Field of Search ....... 156/607, DIG. 64, DIG. 88; 423/348, 350; 264/298; 65/99.6, 182, 3; 427/74; 148/174, 255.4; 29/572; 136/258; 357/59

[56] References Cited

U.S. PATENT DOCUMENTS

| | | | |
|---|---|---|---|
| 2,872,299 | 2/1959 | Celmer et al. | 156/607 |
| 3,031,275 | 2/1959 | Shockley | 23/301 |
| 3,317,299 | 5/1967 | Bre | 65/99.6 |
| 3,539,320 | 11/1970 | Plumat et al. | 65/99 |
| 3,880,633 | 4/1975 | Jordan et al | 427/74 |
| 3,899,304 | 8/1975 | Linares | 156/607 |
| 3,933,981 | 1/1976 | Wakefield et al. | 422/249 |
| 4,058,418 | 11/1977 | Lindmayer | 148/175 |
| 4,225,367 | 9/1980 | Anglerot | 156/607 |
| 4,265,933 | 5/1981 | Jordan et al. | 156/DIG. 88 |
| 4,366,024 | 12/1982 | Ast et al. | 156/607 |

FOREIGN PATENT DOCUMENTS

| | | | |
|---|---|---|---|
| 13985 | 8/1980 | European Pat. Off. | 156/607 |
| 1577343 | 10/1980 | United Kingdom | 156/607 |

OTHER PUBLICATIONS

"Investigation of Thin Sheets of High-Quality Single--Crystal Silicon" U.S. Army R and D Contract Research Report PB 163766, Sep. 10, 1960 prepared by F. T. Fitch of W. R. Grace and Co.

*Primary Examiner*—Hiram H. Bernstein
*Attorney, Agent, or Firm*—Buell, Ziesenheim, Beck & Alstadt

[57] ABSTRACT

Sheets of meltable materials are produced by causing the molten material to flow out on a molten support bath of material immiscible therewith having a higher specific gravity than the meltable material. The meltable material is allowed to advance to its equilibrium thickness and that thickness is controlled by adjusting the composition of the molten support material so as to increase the wettability of the meltable material to the molten support layer. The molten sheet is directed into a cooler zone where it solidifies into a crystalline sheet. The process is especially useful for the production of thin semi-conductor crystals. Specifically, thin silicon crystals are grown on a molten lead support by adding tin to the molten support.

6 Claims, 1 Drawing Figure

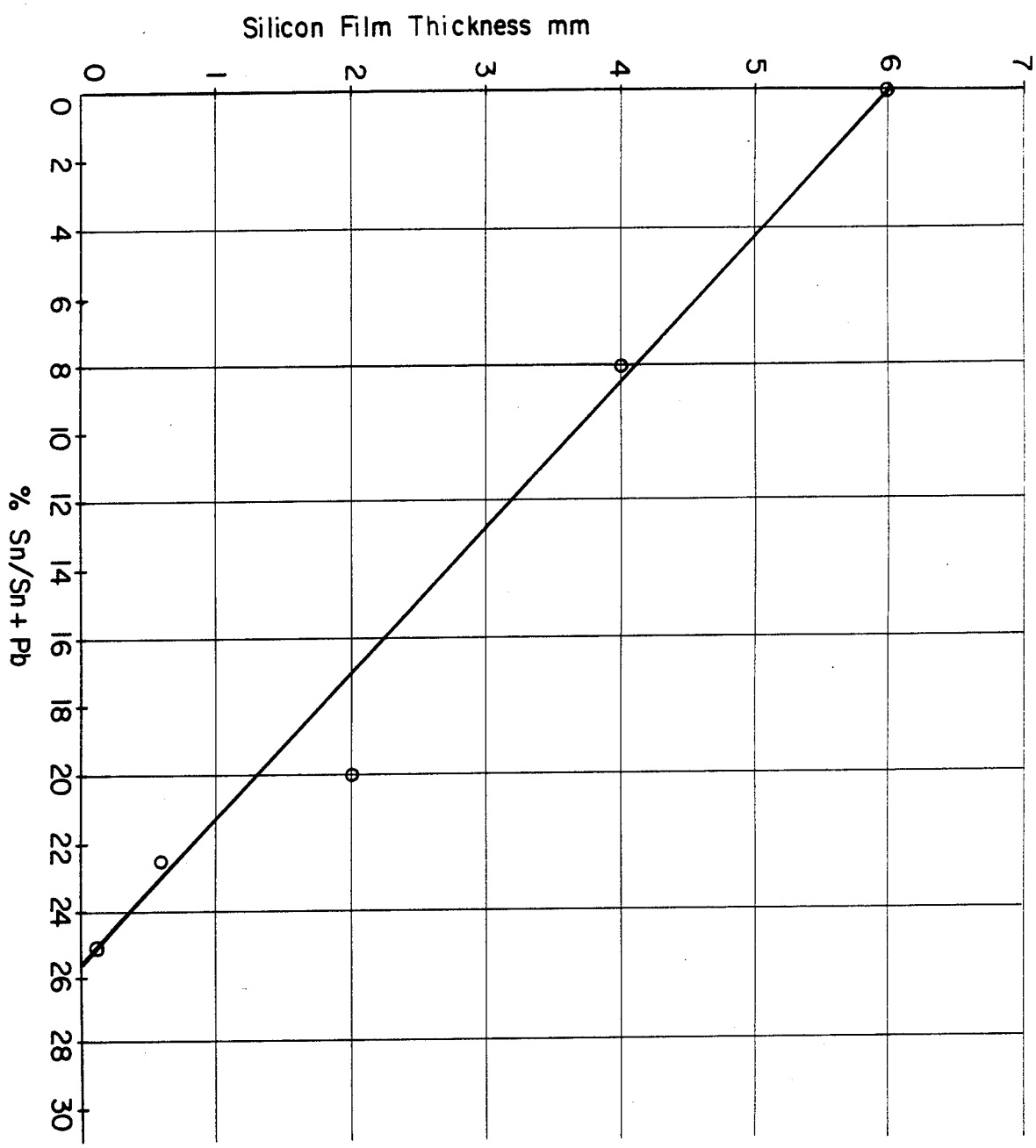

MANUFACTURE OF SHEETS OF CONTROLLED THICKNESS FROM MELTABLE MATERIAL

This application is a continuation-in-part of my application Ser. No. 242,498, filed Mar. 10, 1981, now abandoned.

This invention relates to a method of forming sheets of meltable material by causing it to flow out and solidify on a supporting layer of molten materal immiscible therewith of higher specific gravity. It is more particularly concerned with such a method providing control of the thickness of such sheets, particularly sheets of semi-conductor material.

BACKGROUND OF THE INVENTION

In the well-known float glass process, molten glass is caused to flow out on a bath or supporting layer of molten tin and to solidify thereon so as to produce sheets with smooth parallel surfaces. That method of manufacture would be desirable for the production of semi-conductor material as single grain or large grain crystalline sheets, if the thickness of such sheets could be adequately controlled. My invention will be described hereinafter principally with respect to the manufacture of such semi-conductor sheets, but it is also suitable for the production of sheets of other materials as will appear.

The conventional method of growing single crystals for semi-conductor purposes is to grow a single crystal of the semi-conductor in round rod form and then saw it into round wafers of the desired thickness. Subsequent operations usually involve grinding, lapping and polishing the wafer to obtain the precise final dimensions and surface quality required. Those operations reduce a large proportion of the original crystal to waste. A method of growing silicon crystals in sheet form was disclosed in U.S. Pat. No. 3,031,275 issued Apr. 24, 1962 to William Shockley and made a part hereof. In the Shockley method, the crystals are grown on a molten support layer which is immiscible with the crystal-forming material and has a specific gravity higher than the crystal-forming material in both the liquid and the solid phases of the latter material. The support layer disclosed by Shockley is molten lead. The polycrystalline feed material is fed into a pre-determined zone or area of the molten support which is maintained at a temperature higher than the melting point of the crystal-forming material. It is melted and flows across the surface of the support layer into a cooler temperature zone where it freezes as a sheet of crystalline material. The sheet is continuously withdrawn as fresh polycrystalline feed material is continuously added at the hot end of the process. The patent says that the thickness of the plate is determined by the temperature of the molten zone, the rate of feed, and the rate at which the crystal is withdrawn.

Contrary to the assertions of the patent, I have found that those factors will not control the thickness of the floating silicon film so as to grow thin sheet in the manner disclosed by Shockley. Simple (or Newtonian) immiscible liquids behave like oil on water or mercury on a smooth flat surface. The floating film, if unconstrained, rapidly adopts a specific equilibrium thickness. It will maintain that equilibrium thickness, spreading or contracting in one or both of its other dimensions as required to satisfy process dynamics, i.e., the rate of feed and rate of withdrawal. That equilibrium thickness, for silicon on molten lead, has been determined by me to be 6 millimeters. Other investigators have determined it to be 4 millimeters—see "Investigation of Thin Sheets of High Quality Single Crystal Silicon" U.S. Army R and D Contract Research Report PB 163766, Sept. 10, 1960 prepared by F. T. Fitch of W. R. Grace and Co. Neither of those thicknesses is small enough to economically obviate sawing or slicing. The sheet should be not more than 2 millimeters in thickness to be economically usable without further machining operations and the thinner the sheet can be made the more desirable it becomes from an economic standpoint. Shockley's method cannot grow silicon crystal sheets on molten lead of a thickness less than the equilibrium thickness of molten silicon on molten lead.

SUMMARY OF THE INVENTION

It is the principal object of my invention to provide a method of forming sheets of meltable material on a support layer of molten material immiscible therewith in which the sheet thickness is readily controlled. It is a specific object to provide such a method of growing a single crystal, controlled grain polycrystalline, or amorphus sheet of a semi-conductor having a thickness of a controlled small value. It is another object to provide such a process in which control of the thickness of the sheet is accomplished by adjusting the composition of the support layer. It is still another object to adjust the support layer composition without deleteriously affecting the crystal grown thereon. Other objects of my invention will become evident from the description thereof which follows.

One would normally expect that the equilibrium thickness of a crystal grown on a molten support can be reduced by increasing the specific gravity of the molten support. As it happens there appears to be no suitable molten support material of a higher specific gravity than lead. Likewise it is difficult to conceive a suitable substance which, added to molten lead, would result in a molten mixture or alloy with a higher specific gravity than lead. Thus, the state of the art in this area has remained where it was in 1962.

I have found that the equilibrium thickness of a sheet of meltable material grown on a molten support layer immiscible therewith can be reduced by adjusting the composition of the support layer. It would appear that the wettability of the meltable material to the molten support layer has been increased in this way. Specifically, I have found that the equilibrium thickness of silicon crystals grown on molten lead is reduced when certain substances which dissolve silicon are added to the molten lead, even though the specific gravity of the lead alloy or mixture so formed is less than that of lead alone.

BRIEF DESCRIPTION OF THE DRAWINGS

The single FIGURE is a graph of silicon thickness as obtained by applicant's process plotted against the percentage of Sn in the predominantly Pb supporting bath.

DESCRIPTION OF PREFERRED EMBODIMENT

My process for producing semi-conductor crystals, preferably carried out in apparatus similar to Shockley's, is a continuous process in which solid polycrystalline material is fed into the surface of a molten bath in an elongated crucible. The crucible is enclosed in a heating furnace in which is maintained a non-reactive atmosphere, such as helium or argon, and the polycrystalline material is fed in at one end. The temperature of the crucible is maintained above the melting point of that material at the feed end. The feed material is melted and flows out onto the surface of the molten support into a cooler temperature zone as is described hereinabove and in the Shockley patent. Nucleation of the crystal-forming material can be initiated on a seed crystal inserted on a rod from the discharge end of the furnace, which rod is then withdrawn, pulling the developing crystal through the discharge end in the form of a continuous sheet.

The molten crystal-forming material, if allowed to, will flow out into a layer of equilibrium thickness on the molten support. I adjust the conditions in the furnace and the speed of feed and withdrawal of the crystal sheet so that the molten crystal-forming material on the supporting layer spreads to the desired width while maintaining its equilibrium thickness. In the absence of any deliberate withdrawal it would flow out in an expanding more or less circular pool on the molten support, but by the adjustments above mentioned I cause the molten crystal-forming material to flow linearly along the crucible while maintaining its equilibrium thickness. It is desirable to avoid contact of the molten crystal-forming material with the crucible walls as it may tend to wet, react with and stick thereon at points of contact.

Shockley's preferred process is to grow single crystals of silicon on a molten lead substrate. My invention will be described hereinafter in that context although it is not limited thereto.

As far as is now known, molten lead does not react deleteriously with molten silicon so as to affect the properties of silicon crystals for semi-conductor or photovoltaic devices. Tin and germanium are neighboring Group IV-A elements in the periodic table which I have found likewise do not react deleteriously with molten silicon, when present in small quantities, in the production of silicon crystals for semi-conductor or photovoltaic devices. Hereinafter I refer to support materials which do not react deleteriously with the molten semi-conductor material to any significant extent as far as concerns the production of crystals of semi-conductor or photovoltaic devices as benign materials. Tin and germanium both form solutions with silicon but molten alloys of tin and/or germanium with lead are immiscible with molten silicon over certain compositional ranges.

Tin has a lower specific gravity than lead, as does germanium, and thus a lead-tin alloy should have a lower specific gravity than lead alone. It would appear that the equilibrium thickness of the molten silicon on a lead-tin molten support layer should be greater than its equilibrium thickness on lead alone. However, I find that the equilibrium thickness of silicon crystals grown on a lead-tin alloy support layer is less than the equilibrium thickness on lead alone.

It is not clear why this is so. In his report above mentioned, Fitch ascribed the undesirable thickness of his silicon lenses to the high surface tension of molten silicon. The surface tension of molten silicon at 1450° C. is reported to be 725 dynes/cm, while the surface tension of lead at its melting point is reported to be 450 dynes/cm. At 1600° C. its surface tension drops to 310 dynes/cm. Surface tension of tin at its melting point is reported as 537 dynes/cm and at 1000° C. is 470 dynes/cm, (Handbook of Chemistry and Physics 55th Edition, 1974-75). Thus it would seem that a lead-tin support alloy would have somewhat higher surface tension than the lead alone and it is not evident that the tin addition would do anything to reduce the surface tension of molten silicon. It is conceivable that tin additions to molten lead could reduce the interfacial surface tension between molten silicon and the lead-tin molten support and that this reduction might be more than sufficient to overcome the effect of the reduction of specific gravity of the support metal.

Tin and germanium form solutions with silicon and with lead as is mentioned above. It is conceivable that the addition of tin or germanium or both to molten lead could increase the wettability of the silicon to the support material and thus reduce the equilibrium thickness of molten silicon on the molten support layer.

The equilibrium thickness of molten silicon on molten lead and lead-tin supports was determined by melting pieces of solid silicon on the support in a small quartz crucible under a non-reactive atmosphere, holding the temperature in the crucible above the melting point of the support layer for several minutes, thus allowing the molten silicon to flow out in a pool on the support layer and reach its equilibrium thickness, then cooling the crucible gradually and finally measuring the thickness of the solid silicon pool.

Tin additions to the lead support were varied from zero to 25% by weight of the lead-tin support with the results set out in the following table. The accuracy of the figures is expected to be on the order of ±10%.

| Percent Sn / (Sn + Pb) | Silicon Film Thickness Millimeters |
| --- | --- |
| 0 | 6 |
| 8 | 4 |
| 20 | 2 |
| 22.5 | 0.65 |
| 25 | 0.12 |

The results above set out are plotted on the attached FIGURE. It is seen that the various points lie on a straight line except for 20% tin addition. A silicon film thickness of zero would appear to be reached at a tin content of about 26%, certainly by 30%.

While silicon crystals can be sectioned directly from layers of silicon of 2 mm thickness without slicing it into thinner sheet, crystals thinner than about 1 mm are desirable. My process makes it possible to produce that desired thickness or less directly by maintaining a tin content in the lead bath of more than about 20%, preferably between about 21% and 26%.

In my continuous process, the molten support must not dissolve a significant amount of silicon at temperatures just above the melting point of silicon (1420° C.). When solid silicon is fed upon the molten support it must liquify into a layer immiscible with the molten support and float thereon. The floating layer is then lead into and through a lower temperature zone, as is described by Shockley, where the molten silicon freezes into a solid crystalline sheet.

Molten silicon is aggressive and tends to attack most substances with which it comes into contact. I find that a quartz crucible is suitable for containing the molten support material when the latter is lead or a lead-tin alloy. Quartz is apparently wet by molten lead and the lead or lead-tin alloy forms a concave-up meniscus which inhibits the molten silicon layer from contacting the quartz crucible. If sideboards should be desired within the crucible, I find that some forms of silicon nitride are not wet by molten silicon and are therefore, suitable materials for that purpose.

In the foregoing specification I have described presently preferred embodiments of my invention; however, it will be understood that my invention may be otherwise embodied, for example as a batch rather than as a continuous process, within the scope of the following claims.

I claim:

1. In the method of forming sheets of controlled thickness from molten crystalline material on a support layer containing molten lead the improvement comprising supplying molten crystalline material to the support layer so that said material flows out thereon as a layer free to advance to its uniform equilibrium thickness thereon, reducing that layer thickness by adding to the support layer a minor proportion of a benign substance soluble therein which effectively reduces the equilibrium thickness of the molten crystalline material on the support layer and cooling that layer of molten crystalline material to solidify it to a sheet of said reduced equilibrium thickness.

2. The method of claim 1 in which said meltable material is silicon and said substance is tin and/or germanium.

3. The method of claim 2 in which the support layer is lead alloyed with amounts of tin up to about 30%.

4. The method of claim 2 in which the support layer is lead alloyed with amounts of tin between 21% and 26%.

5. The method of claim 2 in which the lead alloy is contained in a stationary crucible wet by the lead alloy whereby the upper surface of the lead alloy is a concave-up meniscus in which the layer of molten silicon is constrained from contacting the crucible.

6. The method of claim 5 in which the crucible is a quartz crucible.

* * * * *

UNITED STATES PATENT AND TRADEMARK OFFICE
CERTIFICATE OF CORRECTION

PATENT NO. : 4,547,259

DATED : October 15, 1985

INVENTOR(S) : WILLIAM A. SANTINI, JR.

It is certified that error appears in the above-identified patent and that said Letters Patent is hereby corrected as shown below:

On the title page,

At [56] References Cited, U.S. PATENT DOCUMENTS, after 3,031,275 change "2/1959" to --4/1962--.

Column 4, line 30, change "+" to --±--.

Signed and Sealed this

Twenty-first Day of January 1986

[SEAL]

Attest:

DONALD J. QUIGG

Attesting Officer

Commissioner of Patents and Trademarks